(12) United States Patent
Dao et al.

(10) Patent No.: US 9,000,935 B2
(45) Date of Patent: Apr. 7, 2015

(54) BATTERY MANAGEMENT SYSTEM

(75) Inventors: Yaun Dao, Phoenix, AZ (US); William Schlanger, Flagstaff, AZ (US)

(73) Assignee: Elite Power Solutions LLC, Tempe, AZ (US)

( * ) Notice: Subject to any disclaimer, the term of this patent is extended or adjusted under 35 U.S.C. 154(b) by 293 days.

(21) Appl. No.: 13/077,136

(22) Filed: Mar. 31, 2011

(65) Prior Publication Data
US 2012/0249334 A1    Oct. 4, 2012

(51) Int. Cl.
*G08B 21/00* (2006.01)
*H04Q 9/00* (2006.01)
*G01R 31/36* (2006.01)

(52) U.S. Cl.
CPC .............. *H04Q 9/00* (2013.01); *G01R 31/3658* (2013.01); *H04Q 2209/10* (2013.01); *H04Q 2209/823* (2013.01); *H04Q 2209/30* (2013.01)

(58) Field of Classification Search
USPC ............. 340/636.1–636.19; 702/63; 320/107, 320/116, 117, 134, 136
See application file for complete search history.

(56) References Cited

U.S. PATENT DOCUMENTS

| | | | |
|---|---|---|---|
| 6,406,806 B1 * | 6/2002 | Keskula et al. ............... | 429/432 |
| 8,219,333 B2 * | 7/2012 | Li ................................... | 702/63 |
| 8,258,747 B2 * | 9/2012 | Andres et al. ................. | 320/116 |
| 2004/0249534 A1 * | 12/2004 | Yamada et al. ................. | 701/36 |
| 2007/0176604 A1 * | 8/2007 | Morimoto ..................... | 324/525 |
| 2007/0182377 A1 * | 8/2007 | Vandensande ................ | 320/132 |
| 2011/0140650 A1 * | 6/2011 | Zhang et al. .................. | 320/103 |
| 2011/0156714 A1 * | 6/2011 | Mizoguchi et al. ........... | 324/434 |
| 2011/0234231 A1 * | 9/2011 | Liu et al. ....................... | 324/429 |
| 2011/0279087 A1 * | 11/2011 | Andres et al. ................. | 320/134 |
| 2012/0319658 A1 * | 12/2012 | White et al. ................... | 320/134 |

* cited by examiner

*Primary Examiner* — Hoi Lau

(74) *Attorney, Agent, or Firm* — Invention To Patent Services; Alex Hobson

(57) ABSTRACT

The present application describes, among other things, a battery management system. The battery management system includes a computing device and first and second battery unit monitoring modules. The computing device includes an output data request port and an input data port. Each battery unit monitoring module is connected in parallel to the input data port of the computing device. In response to a data request from the output data request port of the computing device, the first battery unit monitoring module transmits data of the first battery unit to the input data port of the computing device, and transmits a data request to the second battery unit monitoring module. In response to the data request from the first battery unit monitoring module, the second battery unit monitoring module transmits data of the second battery unit to the input data port of the computing device.

20 Claims, 18 Drawing Sheets

BATTERY MANAGEMENT SYSTEM

BACKGROUND

Current battery management systems obtain data about individual battery units in a battery system. The systems reserve addresses for communication with battery unit sensors and/or battery units. When sensors transmit data about battery units to the management system, the sensors include the address of the battery unit. Such a system may require significant amounts or resources and complex arrangements for connecting the components of the system. Additionally, current systems for battery management may require complex, expensive systems for detecting potentially hazardous connections between battery units and their enclosure, such as a chassis in an electric vehicle.

SUMMARY

A battery management system can include battery unit monitoring modules for obtaining data about battery units in a battery pack. A computing device can obtain the data by sending a data request to the first monitoring module. The first monitoring module obtains and transmits data about its connected battery unit to the computing device and sends a data request to the second monitoring module. The second monitoring module obtains and transmits data about its connected battery to the computing device and sends a data request to the next monitoring module. Each successive monitoring module performs the same steps until all the monitoring modules have sent data about their connected battery units to the computing device. Thus, the computing device needs solely a data request port and input data port(s) to obtain the data for a battery pack.

In one aspect, the present disclosure describes a battery management system. The battery management system includes a computing device with an output data request port and an input data port. The battery management system also includes first and second battery unit monitoring modules, each battery unit monitoring module connected to the input data port of the computing device. In response to a data request from the output data request port of the computing device, the first battery unit monitoring module transmits data of the first battery unit to the input data port of the computing device, and transmits a data request to the second battery unit monitoring module. In response to the data request from the first battery unit monitoring module, the second battery unit monitoring module transmits data of the second battery unit to the input data port of the computing device.

The first battery unit monitoring module can connect to a first battery unit in a battery pack of an electric vehicle. The battery management system can also include wiring connecting the computing device to the battery unit monitoring modules. Because the battery units in a battery pack can be wired in series, the physical locations of the positive and negative terminals arranged in an alternating fashion, the second battery unit monitoring module is oriented in an opposite direction from the first battery unit monitoring module.

The first battery unit monitoring module can include an analog-to-digital converter. The analog-to-digital converter can measure a voltage of the first battery unit. The first battery unit monitoring module can include a temperature monitoring device that measures a temperature of the first battery unit. The temperature can be expressed as a voltage which is applied to an input of the analog-to-digital converter. Data of the first battery unit can be a voltage and a temperature of the first battery unit. Data of the second battery unit can be a voltage and a temperature of the second battery unit.

The computing device can scan the first and second battery unit monitoring modules to determine a number of battery unit monitoring modules in the battery management system. The computing device can transmit a second data request to the first battery unit monitoring module after the computing device has not received data on the input data port for a predetermined period of time. The predetermined period of time may be 20 ms. The computing device can include an analog-to-digital convertor that measures a voltage across the first and second battery units. The computing device can include an analog-to-digital convertor that measures a current flowing in the first and second battery units.

The computing device can output an alarm when an error condition is detected. The error condition can be a high voltage condition, a low voltage condition, a high current condition, a high temperature condition, or a connection fault condition. The computing device can shut off a battery charger when the computing device detects a high voltage condition across the first and second battery units. The computing device can shut off a motor controller when the computing device detects a low voltage condition across the first and second battery units.

The battery management system can include a monitor, such as a video monitor, that displays the data of the first and second battery units. The battery management system can include a connection fault detector that detects a connection between a node at a zero voltage reference level and the first and second battery units. The battery management system can include one or more battery unit balancing systems, each system balancing charge in a battery unit.

In another aspect, the present disclosure describes a battery management system with a computing device and first and second battery unit monitoring modules. The computing device includes a first output data request port and an input data port. The first battery unit monitoring module includes a first input data request port connected to the output data request port of the controller, a first output data port connected to the input data port of the controller, and a second output data request port. The second battery unit monitoring module includes a second input data request port connected to the second output data request port of the first battery unit monitoring module, and a second output data port connected to the input data port of the controller.

In another aspect, the present disclosure describes a method of managing a battery. The method includes transmitting, by a computing device, a first data request to a first battery unit monitoring module. The method also includes transmitting, by the first battery unit monitoring module, data of a first battery unit to an input data port of the computing device in response to the first data request. The method also includes transmitting, by the first battery unit monitoring module, a second data request to a second battery unit monitoring module. The method also includes transmitting, by the second battery unit monitoring module, data of a second battery unit to the input data port of the computing device in response to the second data request.

BRIEF DESCRIPTION OF THE DRAWINGS

The foregoing and other objects, aspects, features, and advantages of the present invention will become more apparent and better understood by referring to the following description taken in conjunction with the accompanying drawings, in which.

DETAILED DESCRIPTION

The present disclosure describes, among other things, certain embodiments of a battery management system. The management system obtains and displays data about battery units in a battery pack. The management system can monitor the voltage and temperature of the individual battery units and/or the entire battery pack. If the management system discovers any of the battery units pose a concern (e.g., the voltage is over or under limits, or the battery unit is overheating), the system can take measures to prevent damage to itself or the battery pack or to alleviate the concern. The system can also take comparable measures if the system detects a connection between any of the battery units and ground. Thus, the battery management system can maintain the consistent operation of the system the battery pack powers, such as an electric vehicle.

Figure 1:
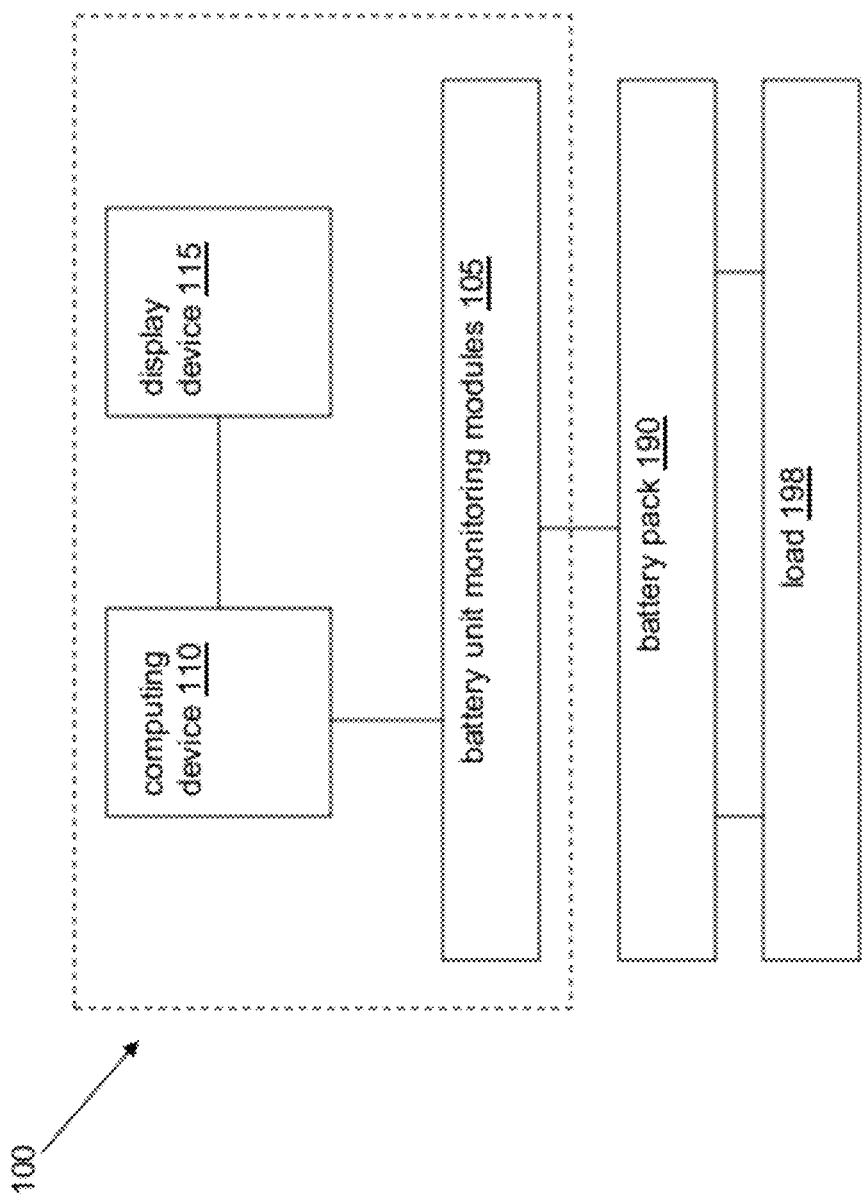
FIG. 1 is a block diagram depicting an exemplary embodiment of a battery management system connected to a battery pack.

Referring now to FIG. 1, a block diagram of an exemplary embodiment of a battery management system 100 connected to a battery pack 190 is shown and described. The battery management system 100 includes battery unit monitoring modules 105 (e.g., sense boards), a computing device 110, and a display 115 (e.g. a monitor such as an LCD monitor or a monitor incorporated into another device, such as a DVD player). The computing device 110 can measure voltage and/or current for the entire battery pack 190 and output the data to the display 115. In various embodiments, the computing device 110 can determine the state of charge of the battery pack 190 by measuring the amount of current that flows in or out of the battery pack 190. The battery pack 190 can integrate the amount of current to determine the state of charge. In some embodiments, when the battery pack 190 reaches a minimum, predetermined voltage, the computing device 110 can set the pack's 190 state of charge to about 0%. When the battery pack 190 reaches a maximum, predetermined voltage, the computing device 110 can set the state of charge to about 100%.

In some embodiments, the battery pack 190 may include a plurality of battery units 195 (e.g., battery cells). Each battery unit may include a battery cell or a plurality of battery cells. The battery pack 190 can connect to an external load 198, such as a motor for an electric vehicle. Each battery unit monitoring modules 105 of the management system 100 can connect to a battery unit 195. A monitoring module 105 can obtain data, such as voltage and/or temperature, for the battery unit 195 connected to the module 105. The monitoring modules 105 can transmit the data to the computing device 110, which can output the data to the display 115.

In some embodiments, the computing device 110 may be configured to operate with a predetermined, fixed number of battery unit monitoring modules 105. In some embodiments, the computing device 110 may be configured to scan the modules 105 to determine the number of modules 105 present. The computing device 110 can scan the battery unit monitoring modules 105 to determine the number of monitoring modules 105 in the system 100. For example, in some embodiments, the computing device 110 can output a scan signal to the first monitoring module 105. In response, the monitoring module 105 can return battery unit voltage and temperature data to the computing device 110 and can output a scan signal to a successive monitoring module 105. In some embodiments, the monitoring module 105 can also return battery unit voltage and temperature data to the computing device 110, and can output a scan signal to the next module 105. Thus, the computing device 110 can count the number of monitoring modules 105 by the number of voltage and temperature data packets received. Further, the computing device 110 can number a monitoring module 105 and/or battery unit 195 based on the module's 105 or unit's 195 position in the order of scan signals received. In some embodiments, a user can configure the computing device 110 to set the number of monitoring modules 105 or to instruct the device 110 to scan the modules 105 and obtain the number of modules itself.

The computing device 110 can detect error conditions for individual battery units 195 and/or the entire battery pack 190. Exemplary error conditions can include conditions such as high voltage conditions, low voltage conditions, high current conditions, and high temperature condition. Another exemplary error can be a connection fault condition, e.g., a connection between at least one battery unit 195 and a contact point with a zero-voltage reference level, such as a chassis of an electric vehicle.

When an error is detected, the computing device 110 can initiate a measure based on the error condition. For example, if the computing device 110 detects a high voltage condition for the entire battery pack 190, the computing device 110 can inactivate a device that charges the pack 190 (not shown). In another example, if the computing device 110 detects a first low voltage condition, the computing device 110 can output a low voltage warning to the display 115. If the battery pack's 190 voltage drops further, triggering a second low voltage condition, the device 110 can inactivate a load connected to the battery pack 190, such as a motor controller of an electric vehicle.

Figure 2:
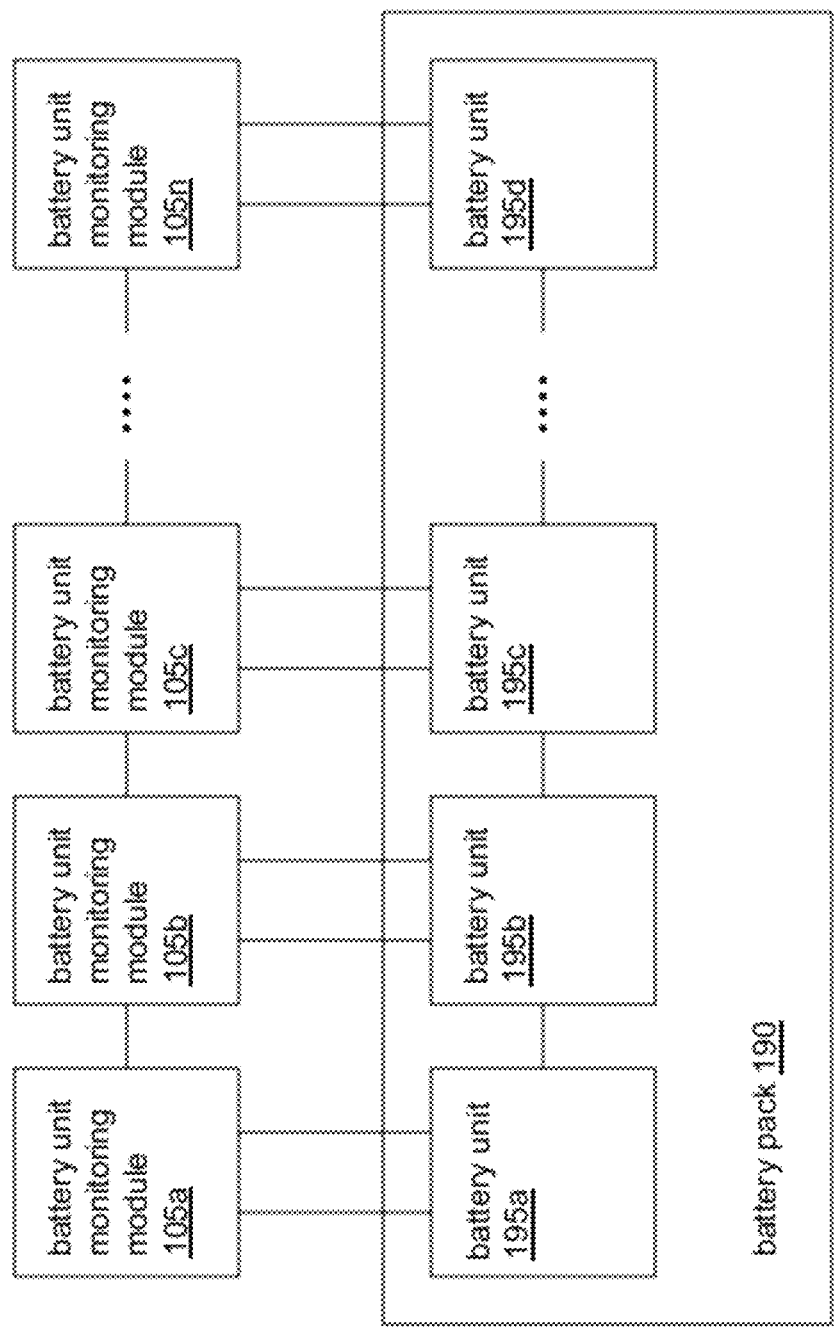
FIG. 2 is a block diagram depicting an exemplary arrangement of battery unit monitoring modules of the battery management system with respect to the battery units of the battery pack.

Referring now to FIG. 2, a block diagram of an exemplary arrangement of battery unit monitoring modules 105 and battery units 195 in a pack 190 is shown and described. In this embodiment, the monitoring modules 105 are connected to the battery units 195, which are connected in series. Each monitoring module 105 can be connected to a single battery unit 195. The battery unit 195 can supply the connected monitoring module 105 with power for performing its operations.

Figure 3:
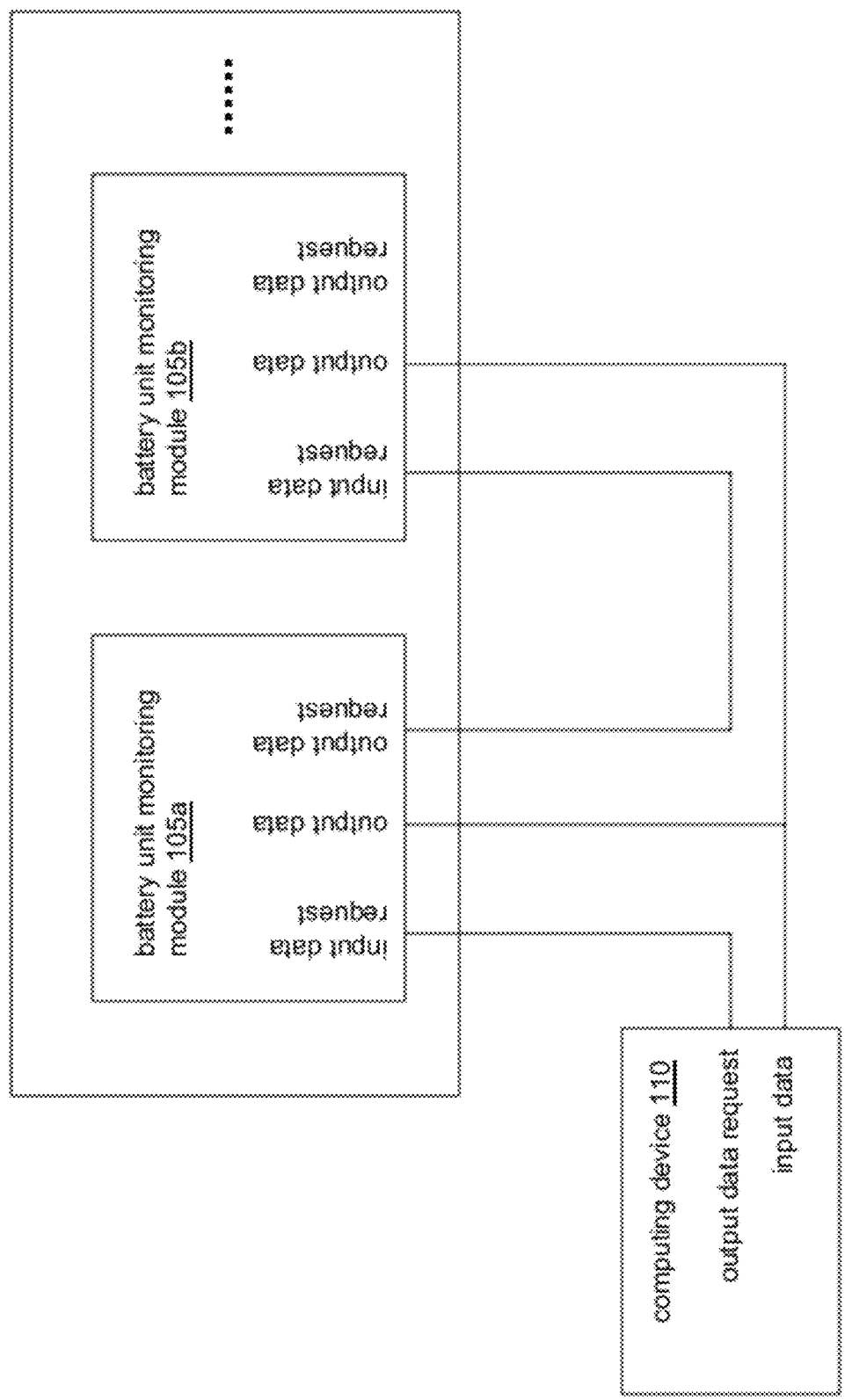
FIG. 3 is a block diagram depicting connections within the battery management system between the computing device and the battery unit monitoring modules.

FIG. 3 is a block diagram depicting connections within the battery management system 100 between the computing device 110 and the battery unit monitoring modules 105. The computing device 110 includes an output data request port (also referred to herein as an "enable output") and an input data port. Each monitoring module 105 includes an output data port, an input data request port (also referred to herein as an "enable input"), and an output data request port. Each monitoring module's 105 output data port is connected in parallel to the computing device's 110 input data port.

The computing device's 110 output data request port is connected to the first one of the battery unit monitoring module's 105*a* input data request port. The monitoring module's 105*a* output data request port is connected to the input data request port of the successive monitoring module 105*b*. In turn, the monitoring module's 105*b* output data request is connected to the input data request port of the next monitoring module 105*c*. The remaining monitoring modules 105 are connected in the same manner. The communications of the computing device 110 and battery unit monitoring modules 105 described herein are transmitted from and received at these ports, as would be understood by one of ordinary skill in the art. Further, in various embodiments, the computing device 110 and monitoring modules 105 include voltage and ground connections such that the computing device 110 can provide power (e.g., 12V) and ground to the monitoring modules 105.

In operation, to obtain data about the battery units 195, the computing device 110 sends a data request signal (also referred to herein as an "enable signal" or an "enable pulse") to the first battery unit monitoring module 105*a*. In response, the monitoring module 105*a* transmits data about a connected battery unit 195*a* to the computing device 110. After the module 105*a* finishes transmitting data, the module 105*a* sends a data request signal to the second battery unit monitoring module 105*b*. In response, the monitoring module 105*b* transmits data about a connected battery unit 195*b* to the computing device 110. After the module 105*b* finishes transmitting data, the module 105*b* sends a data request signal to the third battery unit monitoring module 105*c*, and the process continues for the rest of the monitoring modules 105.

Using this communication system, the computing device 110 can match data with a battery unit according to the order in which the device 110 receives data. Thus, the first set of data can be matched to the first battery unit 195*a*, the second set of data to the second unit 195*b*, and so forth. In this manner, the computing device 110 uses few ports for obtaining data and matching the data to battery units 195. In some embodiments, such a battery management system 100 may eliminate the needs for dedicated addressing ports, addressing switches, and/or jumpers.

When the computing device 110 does not receive data from a battery unit 195 for at least a predetermined period of time (e.g., 20 ms, although other times may be used), the computing device 110 can conclude that data collection for the battery pack 190 has been completed. The computing device 110 can obtain another set of data by transmitting another data request to the first battery unit monitoring module 105*a*, thereby restarting the data collection process. In some embodiments, the computing device 110 can collect data about the battery units 195, e.g., once per 1-2 seconds.

In some embodiments, the computing device 110 can first compare the number of data received with the number of monitoring modules 105. If the numbers match, the computing device 110 can determine all the monitoring modules 105 are operational and continue obtaining data about the battery units 195. If the numbers do not match, the computing device 110 can conclude that at least one monitoring module 105 and/or battery unit 195 is not operational. The computing device 110 can generate and output an error message to the display 115. Since the modules 105 transmit data to the computing device 110 in sequential order, the computing device 110 can identify the non-operational module 105 or unit 195 according to the number of data received. In this manner, the computing device 110 can inform a user of physical locations of faults in the monitoring modules 105 or battery pack 190, allowing the user to troubleshoot problems.

Regarding the individual monitoring modules 105, in some embodiments, a module 105 can measure data for a connected battery unit 195 upon receiving a data request signal. In some embodiments, a module 105 can measure and store data in a buffer. Then, when the module 105 receives the data request signal, the module 105 may access the buffer and may transfer the data stored therein to the computing device 110.

The monitoring module 105 can transmit the data to the computing device 110 in a human readable form. The monitoring modules 105 can transmit the data via an asynchronous serial protocol, such as protocols used for RS-232 or USB connections. The monitoring modules 105 can transmit the data at any rate and with any number of start and/or stop bits. For example, a module 105 can transmit at 9600 Baud with 1 start bit and 1 stop bit.

Figure 4:
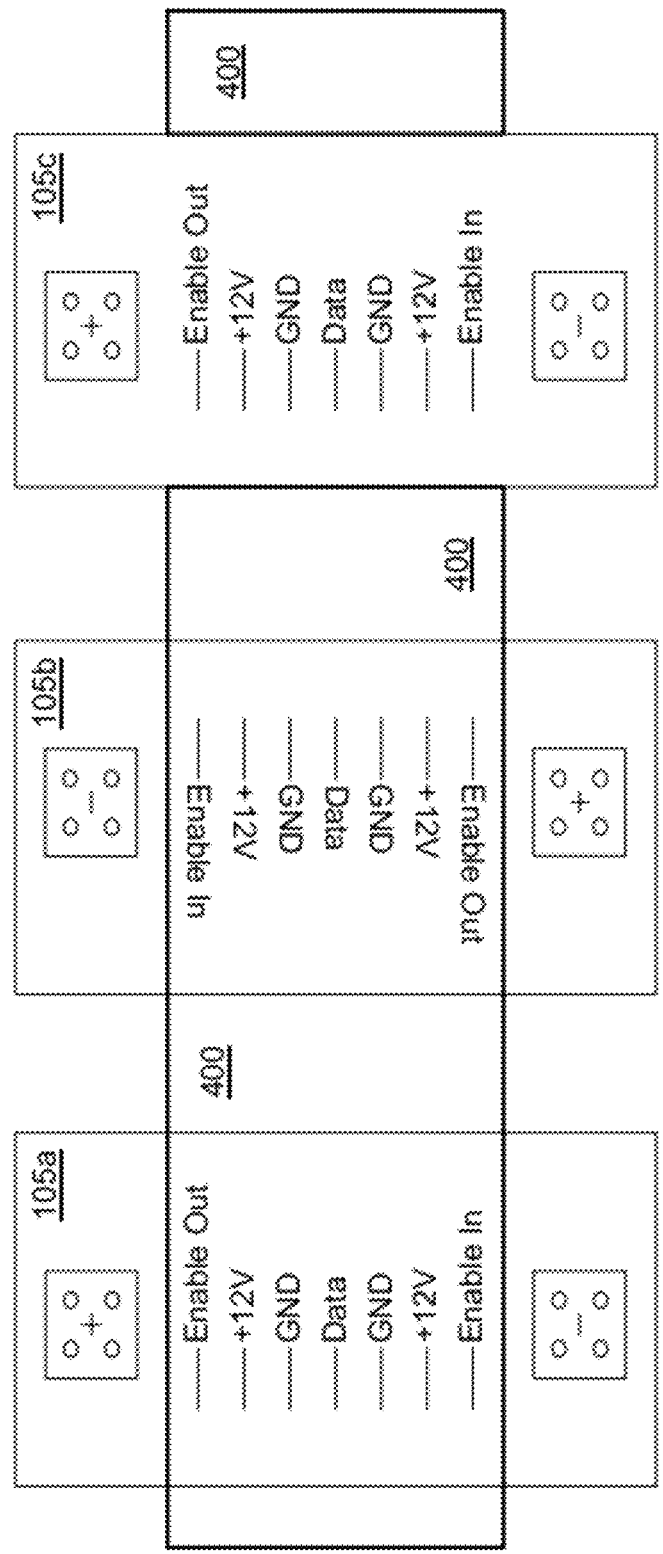
FIG. 4 is a diagram depicting connections between battery unit monitoring modules.

Referring now to FIG. 4, a diagram depicting connections between battery unit monitoring modules 105 is shown and described. In some embodiments, wiring 400 (e.g., ribbon cable, 4-wire round shape harnesses) can be used to connect the monitoring modules 105 to one another. In some embodiments, for each monitoring module 105, the output data port can be located in the center of a module's 105 interface. In some embodiments, the input data request port and the output data request port can be symmetrically located on opposite sides of the output data port. By orienting each battery unit monitoring module 105 in an opposite direction from adjacent modules 105, wiring 400 can connect the output data request port of one module 105 to the input data request port of the successive module 105. Due to the orientation of the ports, the wiring 400 need not be twisted or folded. Further, the wiring 400 can connect all the output data ports to the input data port of the computing device 110. When a monitoring module 105 transmits data for its connected battery unit 195, the data can be sent across each portion of wiring 400 connecting the monitoring modules 105 before the data arrives at the computing device 110.

Figure 5:
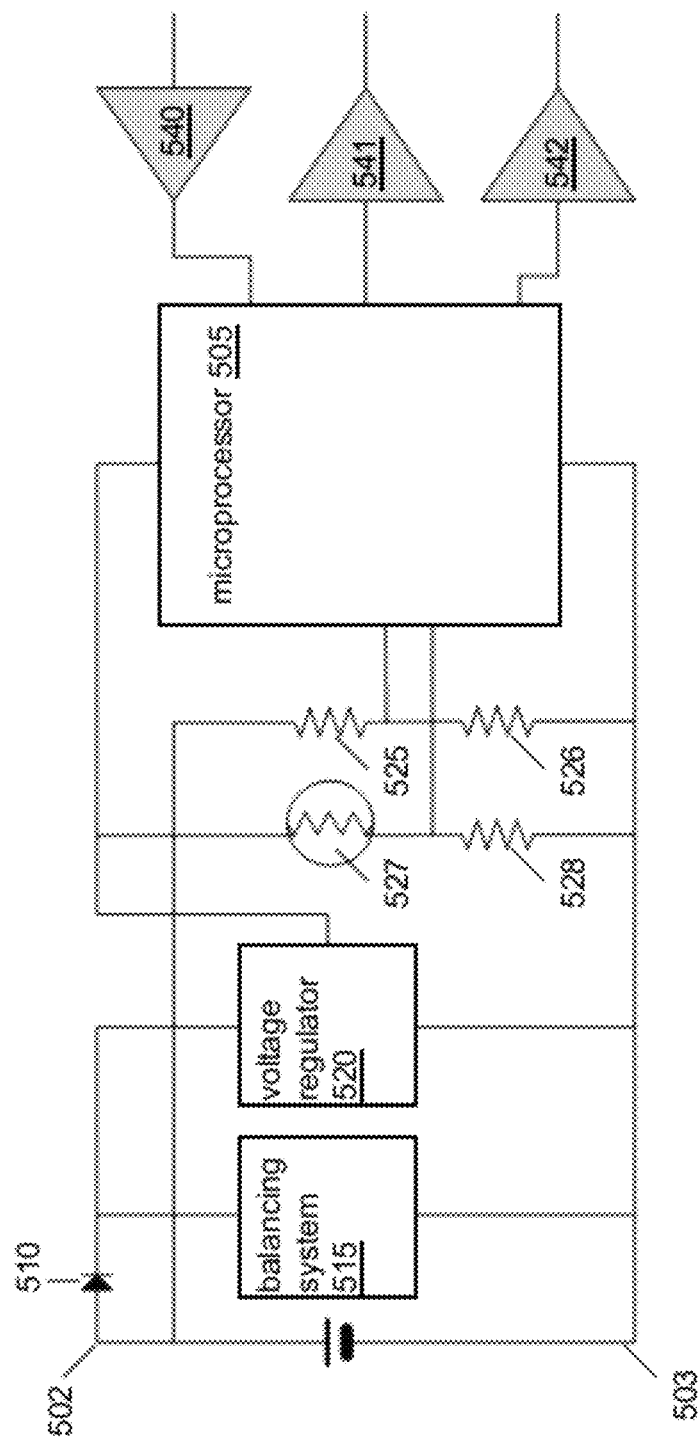
FIG. 5 is a hybrid block and circuit diagram depicting an exemplary battery unit monitoring module.

FIG. 5 is a hybrid block and circuit diagram depicting an exemplary battery unit monitoring module 105. The monitoring module 105 includes terminals 502 and 503, a microprocessor 505, a reverse connection protection system 510, a battery unit balancing system 515, a voltage regulator 520, resistors 525, 526 for sampling a battery unit's 195 voltage, and a temperature monitoring device 527 (e.g., a thermistor) for sampling a battery unit's 195 temperature. The monitoring module 105 also includes a receiver 540 for receiving a data request signal from a computing device 110 or monitoring module 105, a driver 541 for transmitting data of the connected battery unit 195 to the computing device 110, and a driver 542 for transmitting a data request signal to another monitoring module 105.

A battery unit 195 connects to the monitoring module 105 at terminals 502 and 503. Thus, the battery unit 195 applies its voltage to the reverse connection protection system 510. If the voltage is sufficiently high, the protection system 510 conducts and applies the voltage to the voltage regulator 520, resistors 525, 526, temperature monitoring device 527, and balancer 515. If the battery unit 195 is improperly connected to the terminals 502, 503 (e.g., with incorrect polarity), the reverse connection protection system 510 does not conduct, thereby protecting the module 105 from potentially damaging voltages.

When the protection system 510 conducts, the voltage regulator 520 can draw upon the battery unit's 195 voltage to supply a stable voltage (e.g., 2V) for the monitoring module 105. In particular, this voltage can power the microprocessor 505. The microprocessor 505 can obtain the battery unit's 195 voltage via resistors 525 and 526 and/or the temperature via temperature monitoring device 527. In some embodiments, the microprocessor 505 can sample the values on the resistors 525, 526 and temperature monitoring device 527 to obtain the voltage and temperature. The microprocessor 505 can store the values in an internal memory.

In some embodiments, when the receiver 540 receives a data request signal, the receiver 540 transmits the signal to the microprocessor 505. In response, the microprocessor 505 obtains the voltage and temperature of the battery unit 195, either by measuring the values on the resistors 525, 526 and temperature monitoring device 527 or by accessing stored values in an internal memory. The microprocessor 505 transmits the values to the driver 541, which drives the values back to the computing device 110 via, for example, asynchronous serial ASCII communication. At substantially the same time, the microprocessor 505 can generate and output a data request signal to the driver 542. The driver 542 drives the data request signal to the next monitoring module 105 for obtaining data about its connected battery unit 195.

Figure 6:
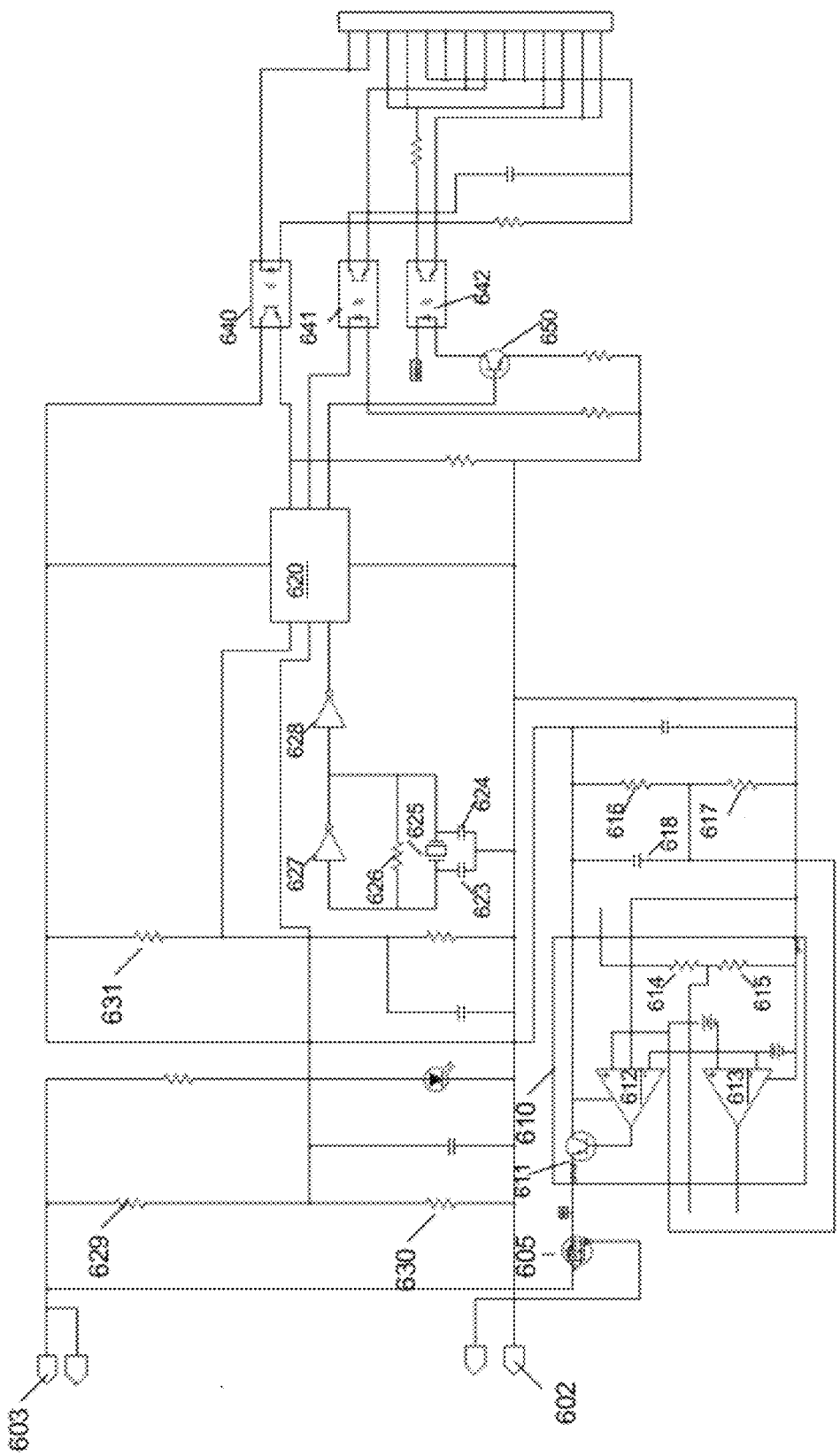
FIG. 6 is a circuit diagram of an exemplary embodiment of a battery unit monitoring module.

Referring now to FIG. 6, a circuit diagram of an exemplary embodiment of a battery unit monitoring module 105 is shown and described. In this embodiment, the terminals 602, 603 correspond to the terminals 502, 503 of FIG. 5. The protection system 510 can be a metal-oxide-semiconductor field effect transistor (MOSFET) 605, such as a p-type MOSFET. Terminals of the battery unit 195 can connect to both the source and base of the MOSFET 605. When the battery unit's 195 voltage is sufficiently high, the voltage activates the MOSFET 605. As the MOSFET 605 conducts, the battery unit 195 applies its voltage to the voltage regulator 610. If the battery unit's 195 voltage is insufficiently high, or its polarity is reversed, the MOSFET 605 does not conduct, thereby protecting the module 105 from potentially damaging voltages. In this manner, the MOSFET 605 can operate as a low voltage drop diode.

The voltage regulator 610 can be an integrated circuit (e.g., a LP2951) which can use a transistor 611, two operational amplifiers 612, 613, and two resistors 614, 615 to regulate a voltage. Resistors 616, 617 can divide the output of the voltage regulator 610 to, for example, 2V. The divided voltage can be fed back to the error amplifier 612, and the regulator 610 can adjust the output accordingly. In this manner, the voltage regulator 610 can output a substantially constant voltage. The capacitor 618 can filter the divided voltage before supplying the voltage to a microprocessor 620. Further, a power supply can power a clock generator (with capacitors 623, 624, an oscillator 625, resistor 626, and buffers 627, 628) to generate a clock signal. The clock signal can be provided to the microprocessor 620 for its operations.

The battery unit 195 can connect, via the terminals 602, 603, to resistors 629, 630 and a thermistor 631. A node between the resistors 629, 630 and a node adjacent to the thermistor 631 can connect to input ports of the microprocessor 620, which in turn can connect to an internal analog-to-digital converter (also referred to herein as A/D converter). One of the inputs to the internal A/D converter can sample the voltage between the resistors 629, 630 to determine the voltage of the battery unit 195. Another input to the internal A/D converter can sample the temperature of the battery unit 195, expressed as a voltage, via the thermistor 631. The microprocessor 620 can store the voltage and temperature in an internal memory. In some embodiments, the microprocessor 620 connects to separate A/D converters that sample the voltage and temperature.

The microprocessor 620 can receive a data request signal via the receiver 640 (e.g., an optocoupler). In response, the microprocessor 620 can obtain the voltage and temperature of the battery unit 195 and transmit the values to the driver 641, which drives the values back to the computing device 110. At substantially the same time, the microprocessor 620 can generate and output a data request signal. The data request signal can connect to the base of a transistor 650. When the signal turns on the transistor, a current flows through the driver 642 to output another data request signal to the next monitoring module 105.

Figure 7:
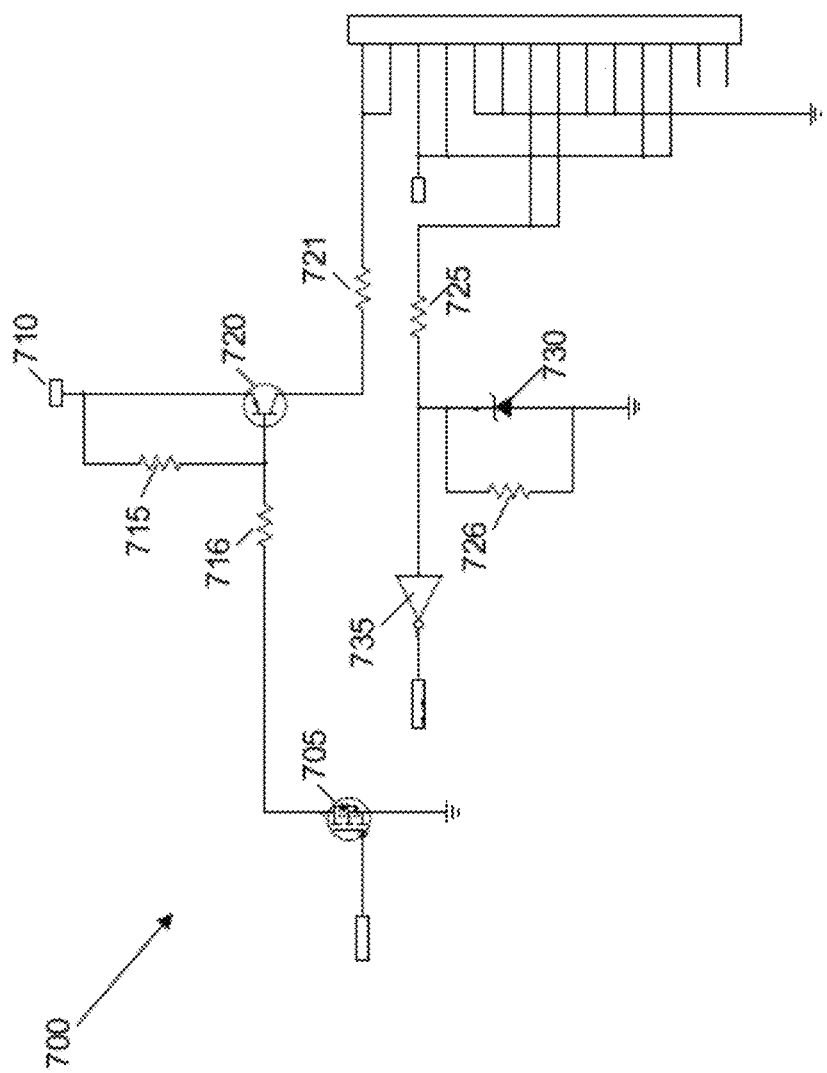
FIG. 7 is a circuit diagram of an exemplary embodiment of the interface for a computing device.

FIG. 7 is a circuit diagram of an exemplary embodiment of an interface 700 for the computing device 110. The interface 700 can be used by the computing device 110 for communicating with to battery unit monitoring modules 105. The computing device 110 can apply a data request signal to the gate of a transistor 705, such as a metal-oxide-semiconductor field-effect transistor (MOSFET). In response, the transistor 705 conducts and current flows from the voltage source 710 through the resistors 715, 716. The voltage that develops at the node between the resistors 715, 716 activates the transistor 720. As a result, current flows from the voltage source 710 through the transistor 720 and resistor 721 to output a data request signal (e.g., a logic high signal) for the first battery unit monitoring module 105.

The circuit can receive a data signal (e.g., as 12V signal) through the TX pins on a connector. Resistors 725, 726 can divide the data signal, and the Zener diode 730 can clamp the data signal to a voltage substantially equal to the voltage supplied to the battery unit monitoring module's microprocessor (e.g., 3.3V). An inverter 735, such as a Schmitt Trigger inverter, can eliminate noise and sharpen the rise and fall times of the divided and/or clamped data signal before passing the data signal to the microprocessor of the computing device 110.

In various embodiments, the interface 700 can be located on the same board as the other components of the computing device 110. In some embodiments, the communication interface can be isolated from those other components.

Figure 8:
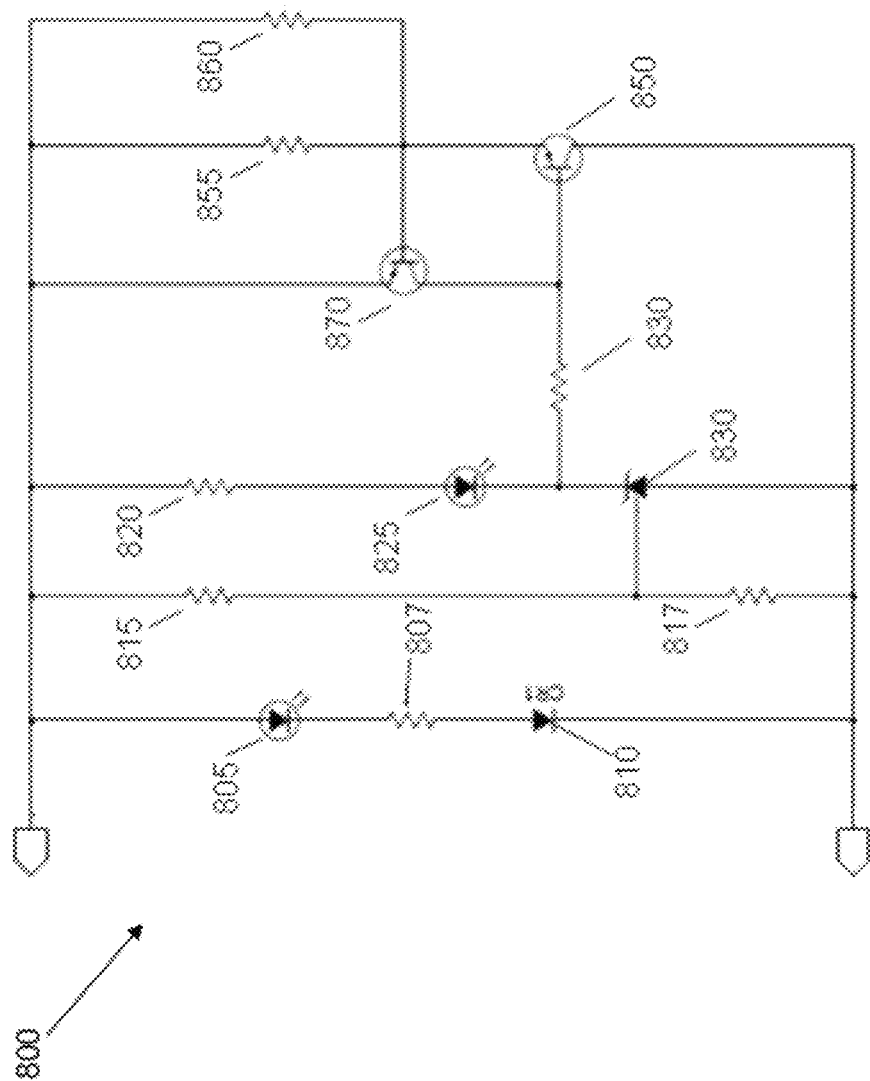
FIG. 8 is a circuit diagram of an exemplary embodiment of a battery unit balancing system in a battery unit monitoring module.

FIG. 8 is a circuit diagram of an exemplary embodiment of a balancing unit 800 of a battery unit monitoring module 105.

The operation of the balancing unit is described in U.S. application Ser. No. 12/939,889, entitled "Battery Unit Balancing System," filed Nov. 4, 2010, the contents of which are hereby incorporated by reference in their entirety.

Figure 9:
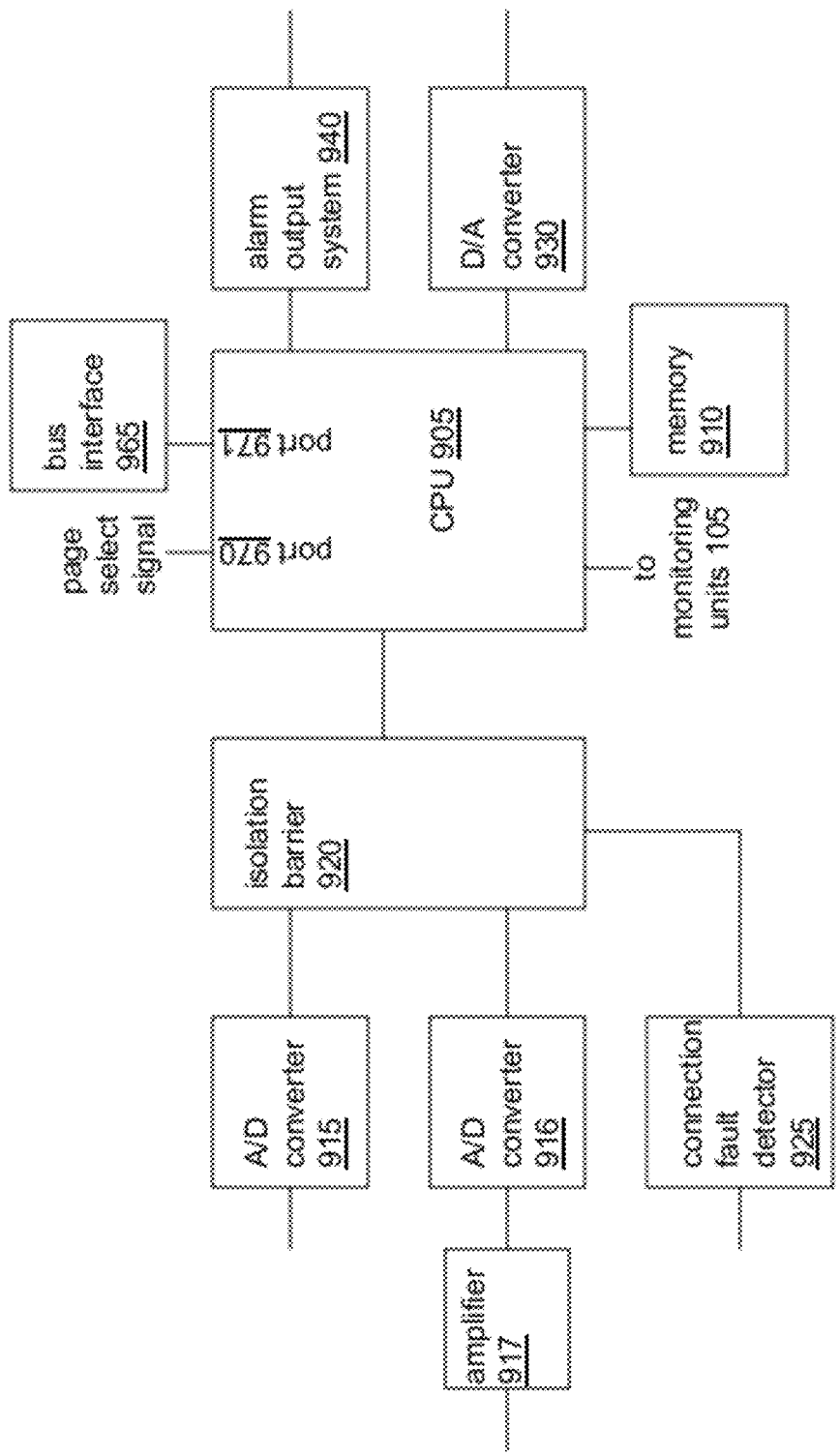
FIG. 9 is a block diagram depicting an exemplary embodiment of the computing device of the battery management system.

FIG. 9 is a block diagram depicting an exemplary embodiment of the computing device 110 of the battery management system 100. The computing device 110 can include a central processing unit (CPU, e.g. 8-core processor) 905 and a memory 910 (e.g., electrically erasable programmable read-only memory, or EEPROM serial memory) that stores a program with executable instructions. The program can be loaded into the memory 910 from an external device connected via, for example, the bus interface 965 or a USB cable. The CPU 905 can load and execute instructions from the memory 910 to perform its operations. The program may include configuration data, such as the predetermined number of battery unit monitoring modules 105 in the system 100 or the threshold battery unit voltage or temperature that would trigger an error condition. In some embodiments, the program may obtain the configuration data from values input by a user of the system 100.

The computing device 110 can use an analog-to-digital (A/D) converter 915 to measure the voltage of the battery pack 190. The A/D converter 915 can sample the voltage to obtain a value. The computing device 110 can use an analog-to-digital (A/D) converter 916 to measure the current of the battery pack 190. In some embodiments, the A/D converter 916 is connected to a shunt, which in turn is connected to a terminal of the battery pack 190 and a terminal of the external load 198. The shunt can be a resistor that develops a voltage drop proportional to the battery pack's 190 current (e.g., 0.0001 Ohms developing a voltage drop of 0.1 mV/A). An amplifier 917 can amplify the value of the current before the A/D converter 916 samples the current. The A/D converters 915, 916 can direct the battery pack voltage and current to an isolation barrier 920 controlled by a signal from a connection fault detector 925. In some embodiments, the A/D converters 915, 916 are on the same board as the CPU 905, isolated, and/or both.

The connection fault detector 925 can signal the presence of a connection between a battery unit 195 and a zero-voltage reference level. For example, the zero-voltage reference level can be the battery pack's 190 enclosure or chassis, and the connection between a battery unit 195 and the chassis would represent a hazard to service personnel. When one or more battery units 195 within the battery pack 190 contacts a point at the zero-voltage reference level, the contact can cause current to flow from the battery unit 195. The connection fault detector 925 detects the connection and outputs a signal to the CPU 905 which will display a warning indicating this connection on the display device 115.

The CPU 905 can connect to the battery unit monitoring modules 105 to obtain data about the individual battery units 195, as described in reference to FIGS. 3-5. The CPU 905 can process data about the individual battery units 195 and/or battery pack 190 to create a composite video signal. A digital-to-analog (D/A) converter 930 (e.g., a 3-bit converter) can produce the composite video signal from digital to analog format so the signal can be displayed on a display 115.

If the CPU 905 detects an error condition, the CPU 905 can transmit an error signal to an alarm output system 940. The system 940 can be used to control a component and/or device that responds to the error signal (e.g., a charger that stops charging the battery pack 190, or a motor controller of an electric vehicle that stops discharging the battery).

The computing device 110 can include power supplies 960 (not shown on FIG. 9). The power supplies 960 supply voltages to components of the battery management system 100. In some embodiments, a power supply 960 can include an internal voltage regulator to provide a constant voltage. The power supplies 960 can be isolated from the other components of the computing device 110 to prevent damage to the device 110.

The computing device 110 can include an interface 965, such as a controller area network (CAN) interface. The interface can include ports, such as parallel port pins. The computing device 110 can connect to external devices via an interface (not shown). For example, the device 110 can connect to another computing device to receive a program to be stored in the memory 910.

The computing device 110 can include a port 970 for receiving a page select signal. A page can correspond to a format for displaying data about a battery unit 195 within the battery pack 190. For example, one page can display the data for the entire pack 190. Another page can display the voltages and temperatures of eight, twenty, or any other number of battery units 195. Successive pages can display the same information for adjacent sets of battery units 195. The computing device 110 can receive the page select signal from a switch mounted in a dashboard in an electric vehicle, for example (not shown). In response, the computing device 110 can output the selected page containing battery pack data to the display 115.

Figure 10:
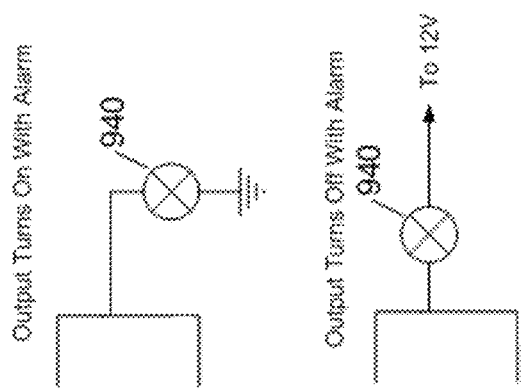
FIG. 10 is a block diagram depicting an exemplary embodiment of the alarm output system of the computing device.

FIG. 10 is a block diagram depicting an exemplary embodiment of the alarm output system 940 of the computing device 110. The alarm output system 940 receives an error signal from the computing device 110. The alarm output system 940 outputs a binary signal according to the error signal. If the error signal corresponds to an off signal, the system 940 allows current to flow to a ground reference, thereby outputting a logic low signal (e.g., 0V). If the error signal corresponds to an on signal, the system 940 allows current to flow from a voltage source, such as 12V. In some embodiments, the system 940 does not allow current to flow until the error signal lasts at least 30 seconds. In this manner, the system 940 turns on or off external devices according to the presence of an error.

Figure 11:
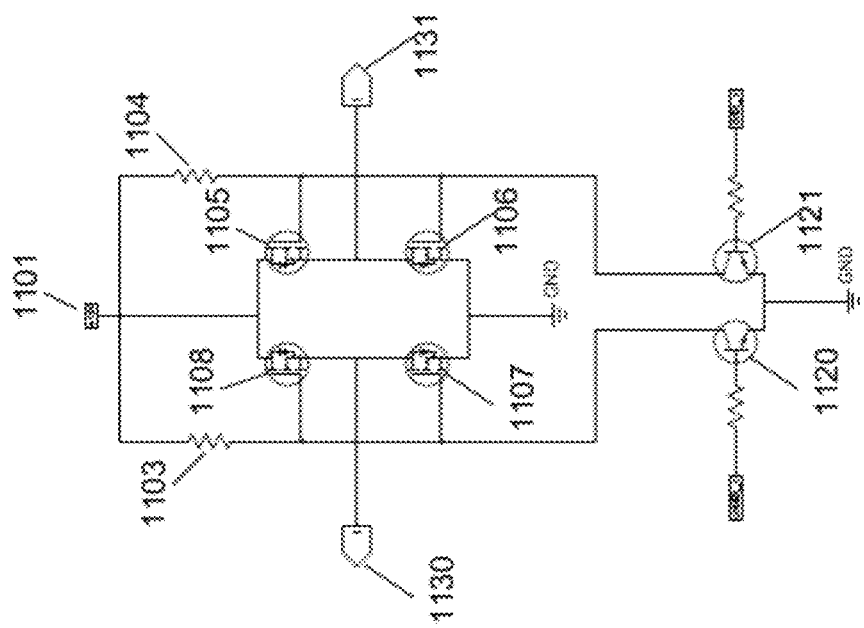
FIG. 11 is a circuit diagram depicting an exemplary embodiment of the alarm output system of the computing device.

FIG. 11 is a circuit diagram depicting an exemplary embodiment of the alarm output system 940 of the computing device 110. The alarm output system 940 includes a voltage source 1101, two resistors 1103, 1104, four transistors (e.g., metal-oxide-semiconductor field-effect transistors or MOSFETs) 1105, 1106, 1107, 1108 configured to form an H bridge, and two transistors 1120, 1121 that operate the alarm output system 940. Transistors 1105, 1108 can be of opposite polarity from transistors 1106, 1107. The alarm output system 940 can apply one or more received error signals to the transistors 1120, 1121 and output one or more command signals corresponding to the error signals at terminals 1130, 1131.

In operation, an error signal can be applied to transistor 1120 and/or transistor 1121. If the computing device 110 detects a low voltage condition, the device 110 can apply an error signal to transistor 1120. As transistor 1120 conducts, the voltage applied to the gates of transistors 1107, 1108 by the voltage source 1101 drops. The voltage differential between the source and gate of transistor 1107 decreases to turn the transistor 1107 off. The voltage differential between the source and gate of transistor 1108 increases to turn the transistor 1108 on. As transistor 1108 conducts, current flows from the voltage source 1101 through the transistor 1108 to the output terminal 1130. The voltage that develops on the output terminal 1130 can be used to shut off a motor controller, by way of example.

If the computing device 110 detects a high voltage condition, a high current condition, or a high temperature condition, the device 110 can apply an error signal to transistor 1121. As transistor 1121 conducts, the voltage applied to the gates of transistors 1105, 1106 by the voltage source 1101 drops. The voltage differential between the source and gate of transistor 1106 decreases to turn the transistor 1107 off. The voltage differential between the source and gate of transistor 1108 increases to turn the transistor 1105 on. As transistor 1105 conducts, current flows from the voltage source 1101 through the transistor 1105 to the output terminal 1131. The voltage that develops on the output terminal 1130 can be used to shut off a battery charger or turn on a fan, by way of example.

Figure 12:
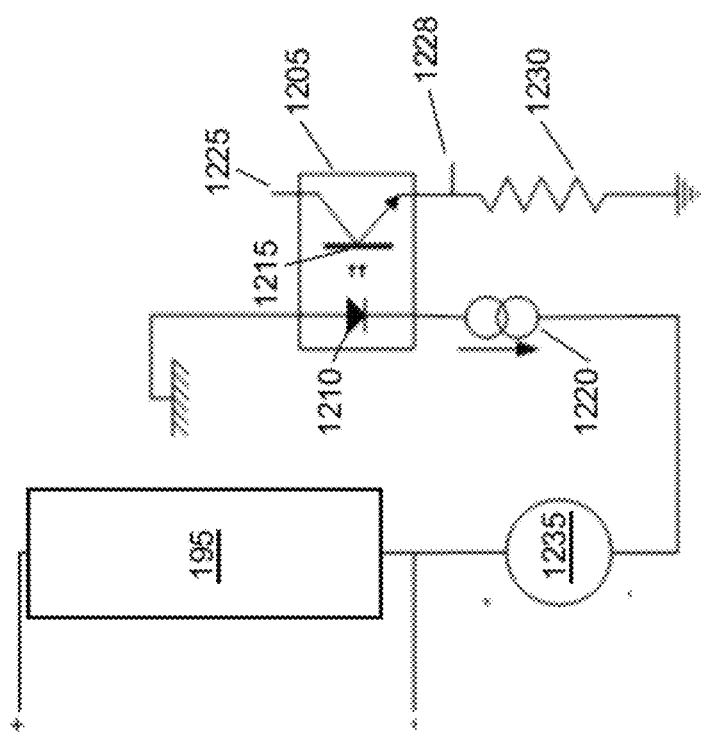
FIG. 12 is a block diagram depicting an exemplary embodiment of the connection fault detection system of the computing device.

FIG. 12 is a circuit diagram depicting an exemplary embodiment of the connection fault detection system of the computing device. The connection fault detection system includes an optocoupler 1205 with a light emitting diode 1210 and a transistor 1215, such as a phototransistor. One terminal of the light emitting diode 1210 connects to ground (also referred to herein as "a node at a ground zero reference level"), such as a chassis of an electric vehicle. The other terminal of the light emitting diode 1210 connects to a current sink 1220. One terminal of the transistor 1215 connects to a voltage source 1225. The other terminal connects to a node corresponding to the output 1228 of the optocoupler 1205 (also referred to herein as the "output node"). This node connects to a resistor 1230 that also connects to a ground zero reference level, which can be electrically isolated from the battery pack 190. The current sink 1220 connects to the negative terminal of a voltage source 1235. The positive terminal of the voltage source 1235 connects to the negative terminal of at least one battery unit 195 of the battery pack 190.

In operation, when none of the terminals of the battery units 195 connect to ground, current does not flow through the light emitting diode 1210 of the optocoupler 1205. The light emitting diode 1210 does not activate the transistor 1215, and the transistor 1215 does not conduct. Because the node 1228 corresponding to the optocoupler's 1205 output is disconnected from the voltage source 1225, any charge at the node drains through the resistor 1230 to ground. In this manner, the optocoupler 1205 outputs a logic low signal, such as 0V, indicating that a connection fault has not been detected.

When a positive terminal of a battery unit 195 does connect to a zero-voltage reference level, current flows through the light emitting diode 1210 to the current sink 1220. The current activates the transistor 1215 so the transistor 1215 conducts. Current flows from the voltage source 1225, building charge at the output node 1228. Thus, the optocoupler 1205 outputs a logic high signal indicating that a connection fault has been detected. The logic high signal can be applied to CPU 905, which can output a message to the display device warning an operator of the battery unit management system of a potentially hazardous connection fault.

The voltage sources 1225, 1235 can have any voltage. For example, voltage source 1225 can provide 3.3V. Voltage source 1235 can provide 5.0V. The current sink 1220 can limit the current flowing through itself and the light emitting diode 1210 to any current, such as a minimum safe level of current. For example, the current sink 1220 can limit the current to 2 mA. The current sink 1220 can operate over a range of voltages of the battery pack 190, such as the voltages between the battery pack's 190 positive and negative terminals. In some embodiments, this range can be from about 5V to about 500V. In some embodiments, the current sink 1220 can operate at voltages that exceed the voltage at the positive terminal of the battery pack 190.

Figure 13:
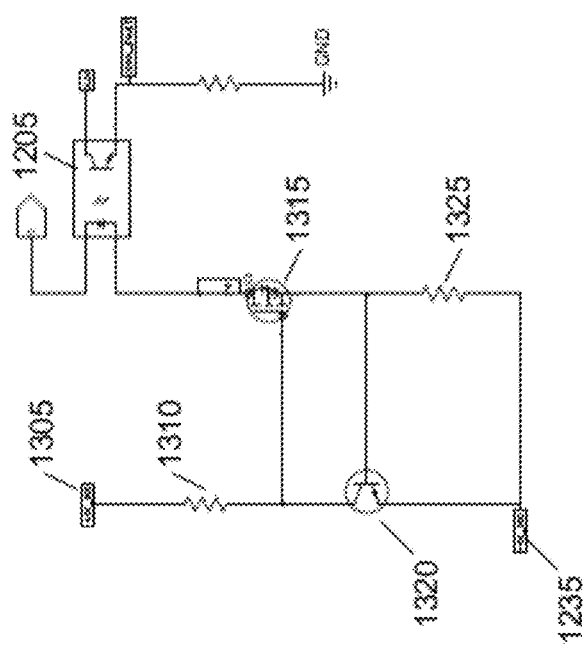
FIG. 13 is a circuit diagram depicting an exemplary embodiment of the connection fault detection system of the computing device.

FIG. 13 is another circuit diagram depicting an exemplary embodiment of the connection fault detection system of the computing device. This embodiment includes all the components described in reference to FIG. 12. In addition, in this embodiment, the current sink 1220 includes a voltage source 1305, a first resistor 1310, a first transistor 1315, a second transistor 1320, and a second resistor 1325. The voltage source 1305 connects to one terminal of the first resistor 1310. The other terminal of the first resistor 1310 connects to the gate of the first transistor 1315 and the emitter of the second transistor 1320. The source of the first transistor 1315 connects to the optocoupler 1205. The drain of the first transistor 1315 connects to the base of the second transistor 1320 and one terminal of the second resistor 1325. The other terminal of the second resistor 1325 connects to the collector of the second transistor 1315 and the negative terminal of the voltage source 1235.

In operation, current flows from the voltage source 1305 through the first resistor 1310 to activate the first transistor 1315 such that the first transistor 1315 conducts. When a terminal of a battery unit 195 connects to ground, current flows through the optocoupler 1205, the first transistor 1315, and the second resistor 1325. The voltage that develops across the second resistor 1325 activates the second transistor 1320. As the second transistor conducts 1320, current is diverted from the gate of the first transistor 1315. The transistors 1315, 1320 and resistors 1310, 1325 reach equilibrium such that a constant current flows through the first transistor 1315.

The transistors 1315 can be any type of transistor, such as a metal-oxide-semiconductor field-effect transistor (MOSFET), an insulated gate bipolar transistor (IGBT), or a NPN transistor. In some embodiments, a 2N3904-type transistor is used for the second transistor 1320.

Figure 14:
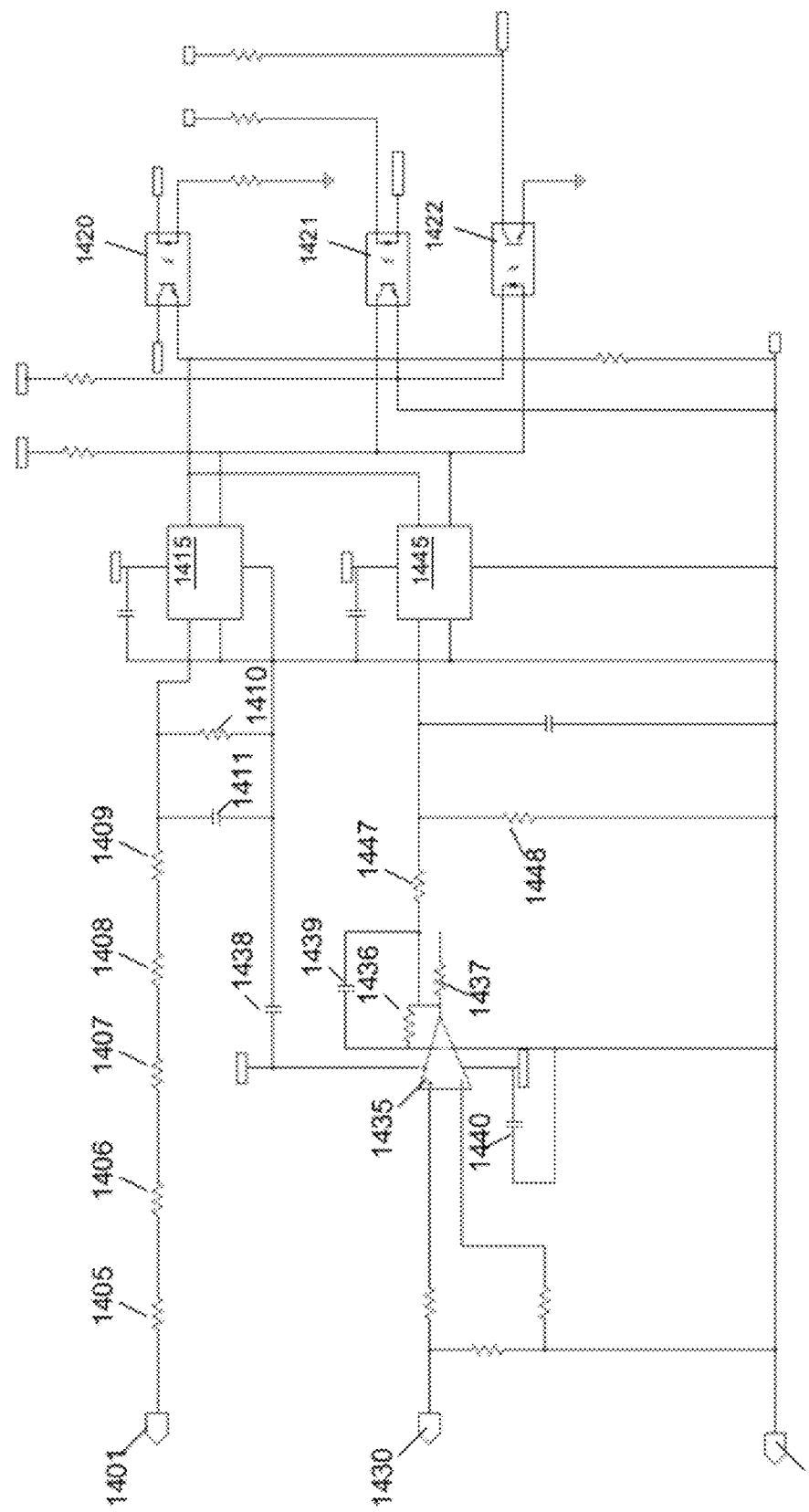
FIG. 14 is a circuit diagram depicting an exemplary embodiment of the pack voltage and pack current input systems of the computing device.

FIG. 14 is a circuit diagram depicting an exemplary embodiment of the pack voltage and pack current input systems of the computing device. The battery pack 190 can connect to the systems at terminals 1401, 1402. Resistors 1405, 1406, 1407, 1408, 1409, 1410 can divide the battery pack 190 voltage from 500V to 2V, by way of example. A capacitor 1411 can filter the divided voltage, and an A/D converter 1415 can sample the voltage. The A/D converter 1415 can transmit the voltage to a processor of the computing device 110, such as CPU 905. Optocouplers 1420, 1421, 1422 can create an isolated communication interface between the A/D converter 1415 and the processor.

The voltage drop across a shunt can be input at terminal 1430. The operational amplifier 1435, resistors 1436, 1437, and capacitors 1438, 1439, 1440 can form an amplifier to amplify the voltage drop. Because the amplifier has a fixed gain, such as 80, the amplified voltage may exceed the capacity of the A/D converter 1445 that samples the voltage. Thus, resistors 1447, 1448 can form a voltage divider that divides the amplified voltage to a level the A/D converter 1445 can process. The A/D converter 1445 can sample the voltage and transmit the voltage to the processor, which can calculate the battery pack 190 current based on the value of the shunt. The A/D converter 1445 can use the same communication interface as the A/D converter 1415 to transmit its sampled voltage.

Figure 15:
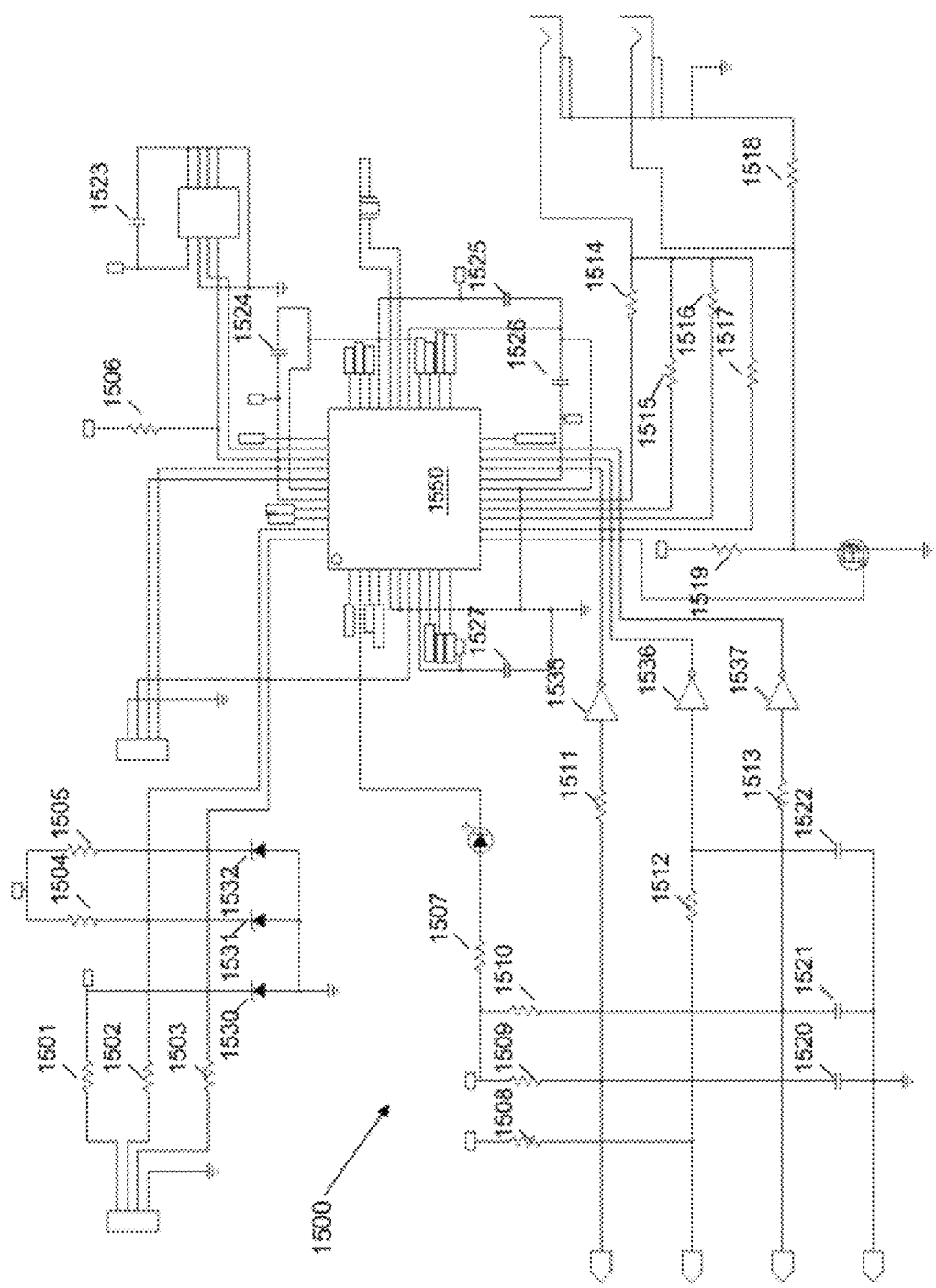
FIG. 15 is a circuit diagram depicting an exemplary embodiment of the processor of the computing device.

FIG. 15 is a circuit diagram depicting an exemplary embodiment 1500 of the central processing unit 905 of the computing device 110. Resistors 1501-1519, capacitors 1520-1527, Zener diodes 1530-1532, and inverters 1535-1537 condition the inputs and outputs for the central processing unit 1550.

Figure 16:
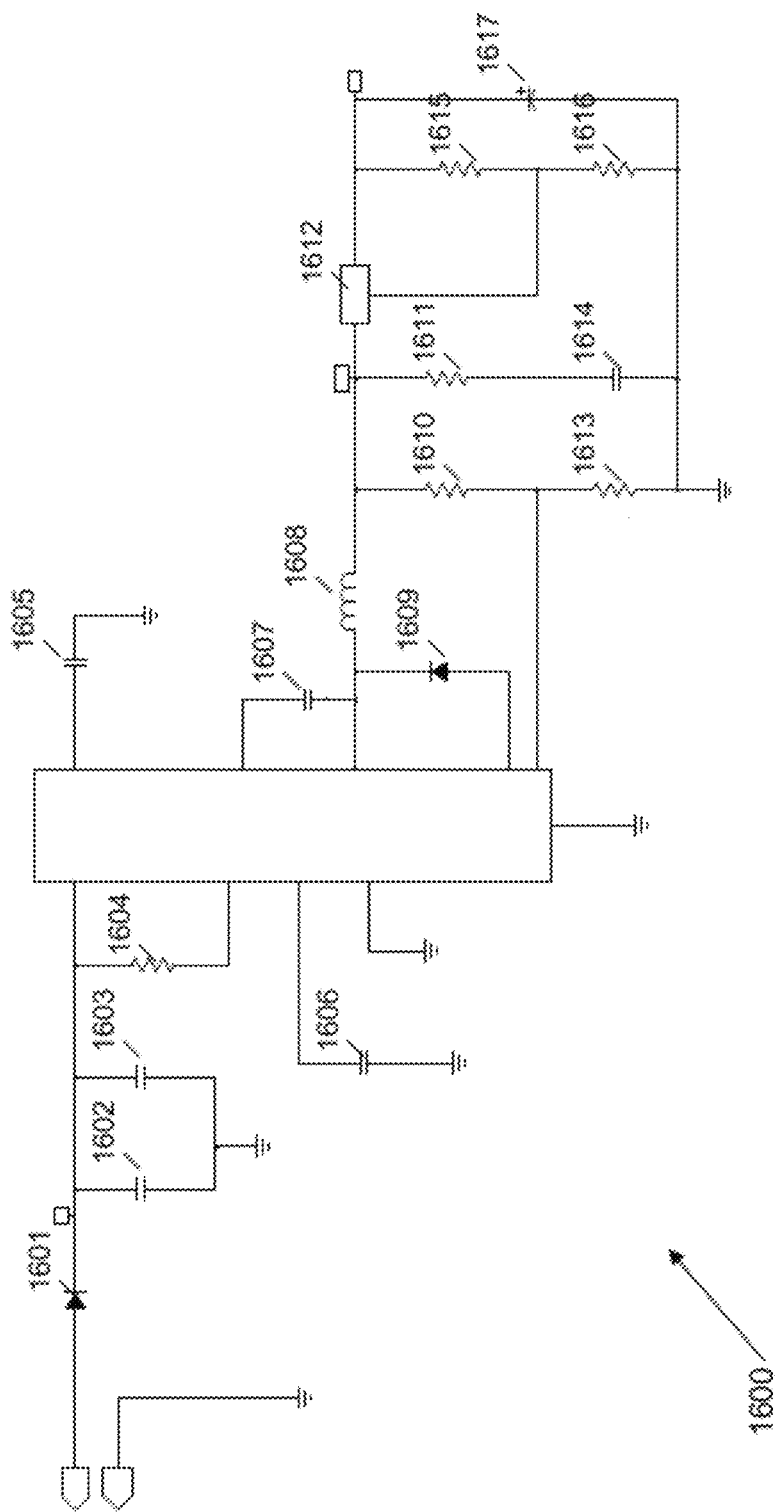
FIG. 16 is a circuit diagram depicting exemplary embodiments of power supplies used with the battery management system.

FIG. 16 is a circuit diagram 1600 depicting an exemplary embodiment of a power supply that can be used with the battery management system 100. The power supply 1600 can be a step down switching voltage regulator. The components 1601-1616 can operate to produce a voltage, such as 5V or 12V. In particular, component 1612 can be a linear voltage regulator that accepts a voltage produced by the other components of the system and outputs a substantially constant 3.3V.

Figure 17:
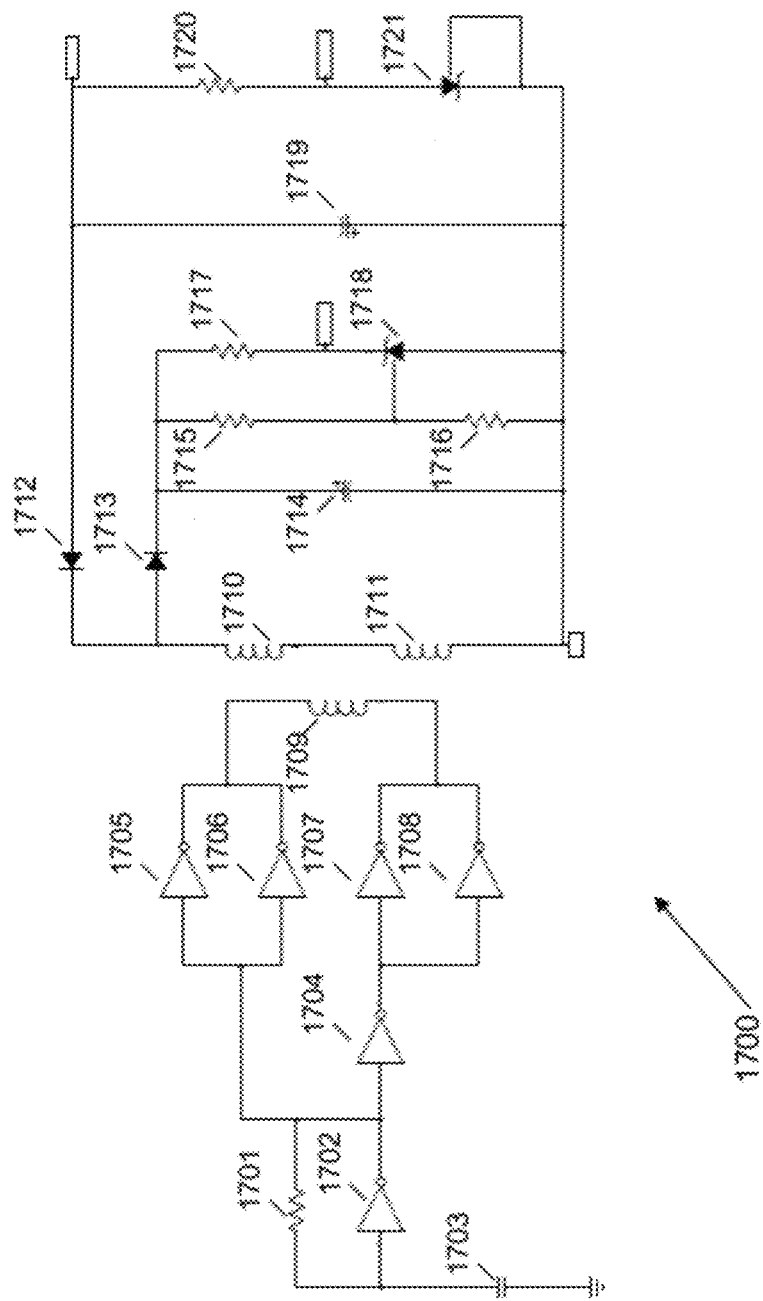
FIG. 17 is a circuit diagram depicting an isolated power supply to power the circuits of FIG. 14.

FIG. 17 is a circuit diagram 1700 depicting an exemplary embodiment of another power supply that can be used with the battery management system 100. The power supply 1700 can be an isolated power supply. Components 1701-1708 can operate as an oscillator that produces 40 KHz. The transformer with windings 1709-1711 can transfer energy produced by the oscillator to components 1712-1721, which can operate as positive and negative half-wave rectifiers and a shunt regulator. The rectifiers and shunt regulator can operate to produce a substantially constant output voltage.

Figure 18:
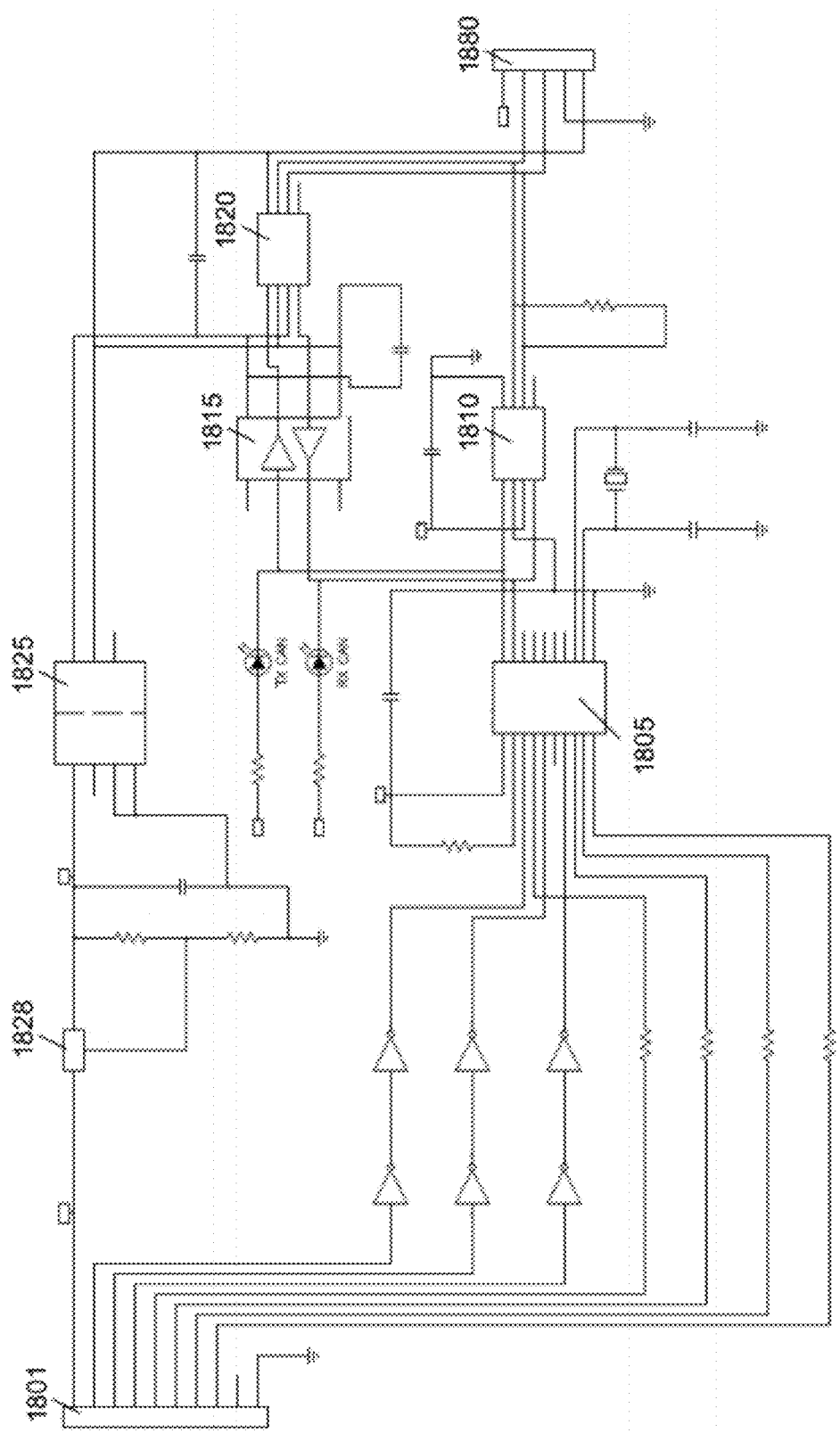
FIG. 18 is a circuit diagram depicting exemplary embodiments of a controller area network (CAN) interface.

FIG. 18 is a circuit diagram depicting an exemplary embodiment of a controller area network (CAN) interface used with the battery management system 100. The interface can be used to connect a CPU 905 of a computing device 110 with an external device via a CAN bus. A connector 1801 can attach to a component of the computing device 110, such as the CPU board. The other connector 1880 can attach to a CAN bus that connects to an external device. The computing device 110 and external device can communicate over the interface using a standard bus protocol such as a serial peripheral interface (SPI) protocol. In some embodiments, the devices can use handshaking signals, such as receiver buffer full and interrupt.

The interface chip 1805 can operate in a non-isolated mode or an isolated mode. In the non-isolated mode, the interface chip 1805 communicates with the bus buffer 1810 with data received, for example, from an external CAN-enabled device. In some embodiments, the bus buffer 1810 can receive data from the bus ports 1880. The interface chip 1805 can send a transmit signal to the buffer 1810 so the buffer 1810 outputs its data to the bus ports 1880. The interface chip 1805 can send a receive signal so the buffer 1810 outputs its data obtained from the bus ports to the interface chip 1805.

In the isolated mode, an isolator 1815 isolates the interface chip's 1805 transmit and receive signals from a buffer 1820. The isolator 1815 can be a magnetic isolator. An isolated power supply 1825 can use a voltage from a voltage regulator 1828 to provide power for the isolator 1815 and buffer 1820. In some embodiments, the voltage regulator 1828 receives a 12V signal and outputs a 5V signal.

In view of the structure, functions and apparatus of the system described herein, the present disclosure provides an efficient and intelligent battery management system. Having described certain embodiments of the battery management system, it will now become apparent to one of skill in the art that other embodiments incorporating the concepts of the disclosure may be used. Therefore, the invention should not be limited to certain embodiments, but should encompass the spirit and scope of the claims.

What is claimed:

1. A battery management system comprising:
   a computing device comprising:
      an output data request port; and
      an input data port;
   a first battery unit monitoring coupled with a first battery unit and comprising:
      an input data request port connected to the output data request port or the computing device; and
      an output data request port;
      an output data port connected to the input data port of the computing device; and
   a second battery unit monitoring module coupled with a second battery unit and comprising:
      a single input data request port connected only to the output data request port of the first battery unit monitoring module, therein defining a module connection between said first battery unit monitoring module and said second battery unit monitoring module;
      an output data port connected to the input data port of the computing device;
   wherein the first battery unit monitoring is a master to said second battery unit monitoring module and the second battery unit monitoring module is a slave to the first battery unit monitoring module,
      wherein the first battery unit monitoring module responds to a data request signal from the output data request port of the computing device by transmitting data of the first battery unit to the input data port of the computing device and subsequently transmits a data request to the second battery unit monitoring module through said module connection; and
      wherein the second battery unit monitoring module responds to the data request from the output data request port the first battery unit monitoring module by transmitting data of the second battery unit to the input data port of the computing device;
      wherein the computing device receives data from the first and second battery unit monitoring modules sequentially after sending a single data request signal to only the first battery unit monitoring module; and
      wherein the computing device receives data from the second battery unit monitoring module automatically after receiving data from the first battery unit monitoring module.

2. The battery management system of claim 1, wherein the first battery unit monitoring module connects to a first battery unit for an electric vehicle.

3. The battery management system of claim 1, wherein the first battery unit monitoring module comprises an analog-to-digital converter that measures a voltage of the first battery unit.

4. The battery management system or claim 1, wherein the first battery unit monitoring module comprises a temperature monitoring device that measures a temperature of the first battery unit.

5. The battery management system of claim 1, wherein the data of the first batter unit is a voltage and a temperature of the first battery unit.

6. The battery management system of claim 5, wherein the data of the second battery unit is a voltage and a temperature of the second battery unit.

7. The battery management system or claim 1, wherein the computing device is configured to scan the first and second battery unit monitoring modules to determine a number of battery unit monitoring modules in the battery management system.

8. The battery management system of claim 1, wherein the computing device transmits a second data request to the first battery unit monitoring module after the computing device has not received data on the input data port for a predetermined period of time.

9. The battery management system of claim 8, wherein the predetermined period of time is 20 ms.

10. The battery management system of claim 1, wherein the computing device further comprises an analog-to-digital convertor that measures a voltage across the first and second battery units.

11. The battery management system of claim 1, wherein the computing device further comprises an analog-to-digital convertor that measures a current flowing in the first and second battery units.

12. The battery management system of claim 1, wherein the computing device is configured to output an alarm when an error condition is detected.

13. The battery management system of claim 12, wherein the error condition is as high voltage condition, a low voltage condition, a high current condition, a high temperature condition or a connection fault condition.

14. The battery management system of claim 1, wherein the computing device is configured to shut off a battery charge when the computing device detects a high voltage condition across the first and second battery units.

15. The battery management system of claim 1, wherein the computing device is configured to shut off a load when the computing device detects a low voltage condition across the first and second battery units.

16. The battery management system of claim 1, further comprising a monitor that is configured to display the data of the first and second battery units.

17. The battery management system of claim 1, further comprising a connection fault detector that to detects a connection between a chassis and the first and second battery units.

18. The battery management system of claim 1, further comprising a battery unit balancing system that is configured to balance the first battery unit.

19. A battery management system comprising:
a computing device with an output data request port, an input data port and an analog-to-digital convertor that measures a voltage across a first and a second battery unit;
a first battery unit monitoring module coupled with a first battery unit and comprising:
a first input data request port connected to said output data request port of said computing device,
a first output data port connected to the input data port of said computing device, and
a second output data request port; and
as second battery unit monitoring module coupled with as second battery unit and comprising:
a single input data request port consisting of a second input data request port connected to the second output data request port of the first battery unit monitoring module therein defining a module connection between said first battery unit monitoring module and said second battery unit monitoring module; and
a second data port connect to the input data port of said computing device;
wherein the first battery unit monitoring is a master to said second battery unit monitoring module and the second battery unit monitoring module is a slave to the first battery unit monitoring module,
wherein the first battery unit monitoring module responds to a data request signal from the output data request port of the computing device by transmitting data of the first battery unit to the input data port of the computing device and subsequently transmit a data request signal to the second battery unit monitoring module through said second output data request port;
wherein the second battery unit monitoring module responds to the data request from the second output data request port of the first battery unit monitoring module by transmitting data of the second battery unit to the input data port of the computing device;
wherein the computing device receives data from the first and second battery unit monitoring modules sequentially after sending a single data request signal to only the first battery unit monitoring module; and
wherein the computing device receives data from the second battery unit monitoring module automatically after receiving data from the first battery unit monitoring module; and
whereby the computing device is configured to shut off a battery charger when the computing device detects a high voltage condition from the first battery unit or the second battery unit.

20. A method of managing a battery comprising the steps of:
providing a battery management system comprising:
a computing device comprising:
an output data request port; and
an input data port;
a first battery unit monitoring module coupled with a first battery unit and comprising:
an input data request port connected to the output data request port of the computing device; and
an output data request port;
an output data port connected to the input data port of the computing device; and
a second battery unit monitoring module coupled with a second battery unit and comprising:
a single input data request port connected only to the output data request port of the first battery unit monitoring module, therein defining a module connection between said first battery unit monitoring module and said second battery unit monitoring module;
an output data port connected to the input data port of the computing device;
wherein the first battery unit monitoring is a master to said second battery unit monitoring module and the second battery unit monitoring module is a slave to the first battery unit monitoring module,
wherein the first battery unit monitoring module responds to a data request signal from the output data request port of the computing device by transmitting data of the first battery unit to the input data port of the computing device and subsequently transmits a data request to the second battery unit monitoring module through said module connection; and
wherein the second battery unit monitoring module responds to the data request from the output data request port the first battery unit monitoring module by transmitting data of the second battery unit to the input data port of the computing device;
transmitting, by the computing device, a first data request signal to the first battery unit monitoring module;
transmitting, by the first battery unit monitoring module, data of the first battery unit to the input data poet of the computing device in response to the first data request signal;
transmitting, by the first battery unit monitoring module, a second data request signal to the second battery unit monitoring module through the module connection between said first battery unit monitoring module and said second battery unit monitoring module, and transmitting, by the second battery unit monitoring module, data of the second battery unit to the input data port of the computing device in response to the second data request signal;

wherein the computing device receives data from the first and second battery unit monitoring modules sequentially after sending a single data request signal to only the first battery unit monitoring module.

\* \* \* \* \*